US005672846A

United States Patent [19]
Marie-Louise Debbaut

[11] Patent Number: 5,672,846
[45] Date of Patent: *Sep. 30, 1997

[54] ELECTRICAL CONNECTOR

[75] Inventor: Christian Arthur Marie-Louise Debbaut, Cary, N.C.

[73] Assignee: Raychem Corporation, Menlo Park, Calif.

[*] Notice: The term of this patent shall not extend beyond the expiration date of Pat. No. 5,140,746.

[21] Appl. No.: 459,584

[22] Filed: Jun. 2, 1995

Related U.S. Application Data

[63] Continuation of Ser. No. 324,420, Oct. 18, 1994, which is a continuation of Ser. No. 933,285, Aug. 21, 1992, Pat. No. 5,357,057, which is a continuation of Ser. No. 396,575, Aug. 21, 1989, Pat. No. 5,140,746, which is a continuation of Ser. No. 183,546, Apr. 18, 1988, Pat. No. 4,864,725, which is a continuation of Ser. No. 38,415, Apr. 9, 1987, abandoned, which is a continuation of Ser. No. 756,559, Jul. 17, 1985, abandoned, which is a continuation of Ser. No. 507,433, Jun. 23, 1983, abandoned, which is a continuation-in-part of Ser. No. 504,000, Jun. 13, 1983, Pat. No. 4,634,207, which is a continuation-in-part of Ser. No. 434,011, Oct. 12, 1982, Pat. No. 4,600,261.

[51] Int. Cl.$^6$ .............. H02G 15/06; H02G 15/10
[52] U.S. Cl. .............. 174/84 R; 174/76; 174/84 C; 174/87; 174/92
[58] Field of Search .............. 174/84 R, 76, 174/84 C, 87, 92, 85, 88 C, 93; 29/855, 858, 868, 749, 871, 872, 862; 524/157, 267, 491, 848

[56] References Cited

U.S. PATENT DOCUMENTS

| Re. 30,321 | 7/1980 | Brauer et al. | 260/18 TN |
|---|---|---|---|
| Re. 31,389 | 9/1983 | Brauer et al. | 210/321.3 |
| 997,066 | 7/1911 | Krannichfeldt . | |
| 2,815,497 | 12/1957 | Redslob | 339/276 |
| 2,906,810 | 9/1959 | D'Ascoli | 174/84 |

(List continued on next page.)

FOREIGN PATENT DOCUMENTS

| 0 046 063 A1 | 2/1982 | European Pat. Off. . |
|---|---|---|
| 52-66979 | 6/1977 | Japan . |
| 54-30609 | 9/1979 | Japan . |
| 1 303 581 | 1/1973 | United Kingdom . |
| 0 020 658 | 11/1979 | United Kingdom . |
| 2 070 658 | 9/1981 | United Kingdom . |

OTHER PUBLICATIONS

M. Meyerstein "Outdoor Connector With Advanced Weather Resistance", Int'l Wire & Cable Symp. Proceedings, pp. 271–276 (1982).
I.E. Martin et al., "Connector Performance . . . Environment", Int'l Wire 2 Cable Symp. Proceeding, pp. 188–193 (1980).
Bell Northern Research, Ltd.; Telesis, vol. 9 No. 4, 1982.
Brochure: Sylgarde® 51 Dielectric Gel: Dow Corning Bulletin: 05–2043 Dec., 1967.
Brochure: Sylgarde® 527 primerless silicone dielectric gel © 1980.
ASTM Designation 50/69 (79) "Standard Test Methods for Cone Penetration of Lubricating Grease".
"Information about Materials for High Technology Applications" (Dow Corning Corp.'s 3–6527 A & B Silicone Dielectric Gel) Copyright 1980.
"Information about Silicone Encapsulants" (Dow Corning Corp.'s Q3–6527 A & B Silicone Dielectric Gel) 1977.
*Materials News* from Dow Corning May/Jun. 1978.

(List continued on next page.)

*Primary Examiner*—Kristine L. Kincaid
*Assistant Examiner*—Chau N. Nguyen
*Attorney, Agent, or Firm*—Herbert G. Burkard

[57] ABSTRACT

An apparatus and process for splicing electrical wires that are to be exposed to an adverse environment. The apparatus includes a connector, an insulating sleeve adapted to retain the connector, and an encapsulant. The encapsulant, which is disposed within the insulating sleeve, has a cone penetration value of 100 to 350 ($10^{-1}$ mm) and an ultimate elongation of at least 200%.

4 Claims, 1 Drawing Sheet

U.S. PATENT DOCUMENTS

| | | | |
|---|---|---|---|
| 3,020,260 | 2/1962 | Nelson | 260/46.5 |
| 3,065,292 | 11/1962 | Chickvary | 174/84 |
| 3,143,595 | 8/1964 | Martin | 174/84 |
| 3,187,088 | 6/1965 | Warner | 174/91 |
| 3,228,820 | 1/1966 | Samson | 156/307 |
| 3,241,095 | 3/1966 | Phillips | 439/199 |
| 3,243,211 | 3/1966 | Wetmore | 287/78 |
| 3,427,393 | 2/1969 | Masterson | 174/23 |
| 3,485,787 | 12/1969 | Hacfele et al. | 260/33.6 |
| 3,522,576 | 8/1970 | Cairns | 439/201 |
| 3,548,420 | 12/1970 | Spence | 3/20 |
| 3,585,275 | 6/1971 | Gillemot et al. | 174/76 |
| 3,619,481 | 11/1971 | Smith | 174/138 F |
| 3,630,905 | 12/1971 | Sorgo | 260/85.1 |
| 3,649,436 | 3/1972 | Buese | 161/160 |
| 3,676,387 | 7/1972 | Lindlof | 260/28.5 |
| 3,678,174 | 7/1972 | Ganzhorn | 174/84 R |
| 3,708,611 | 1/1973 | Dinger | 174/84 C |
| 3,714,110 | 1/1973 | Verdol et al. | 260/33.6 |
| 3,718,619 | 2/1973 | Rustad | 260/47 B |
| 3,731,258 | 5/1973 | Spicer | 339/48 |
| 3,752,306 | 8/1973 | Thompson et al. | 206/47 A |
| 3,755,241 | 8/1973 | Brady | 260/33.6 |
| 3,755,615 | 8/1973 | Paullus | 174/76 |
| 3,801,532 | 4/1974 | Olstowski | 260/33.8 |
| 3,814,836 | 6/1974 | Neale, Sr. | 174/84 |
| 3,827,999 | 8/1974 | Crossland | 260/33.6 |
| 3,846,355 | 11/1974 | Mayer | 260/18 |
| 3,853,385 | 12/1974 | Paiazzetti et al. | 339/96 |
| 3,853,805 | 12/1974 | Miller et al. | 260/37 SB |
| 3,873,757 | 3/1975 | Berke et al. | 174/52 R |
| 3,875,325 | 4/1975 | Anderson et al. | 174/92 |
| 3,879,575 | 4/1975 | Dobbin et al. | 174/76 |
| 3,897,129 | 7/1975 | Farrar | 439/204 |
| 3,916,082 | 10/1975 | Gillemot | 174/41 |
| 3,928,704 | 12/1975 | Heidingsfeld et al. | 428/260 |
| 3,929,949 | 12/1975 | Day | 264/46.4 |
| 3,934,076 | 1/1976 | Smith | 174/87 |
| 3,937,870 | 2/1976 | Bumpstead | 174/87 |
| 3,985,951 | 10/1976 | Harris | 174/138 F |
| 4,010,994 | 3/1977 | Ayst | 439/892 |
| 4,025,717 | 5/1977 | Whittingham | 174/76 |
| 4,039,742 | 8/1977 | Smith | 174/87 |
| 4,070,543 | 1/1978 | Thompson et al. | 174/87 |
| 4,079,511 | 3/1978 | Grabbe | 29/627 |
| 4,102,716 | 7/1978 | Groves et al. | 155/48 |
| 4,151,364 | 4/1979 | Ellis | 174/84 C |
| 4,163,082 | 7/1979 | Romenesko | 428/447 |
| 4,168,258 | 9/1979 | Brauer | 260/33.6 |
| 4,171,998 | 10/1979 | Brauer | 156/48 |
| 4,176,239 | 11/1979 | Brauer | 174/23 C |
| 4,192,569 | 3/1980 | Macci | 339/96 |
| 4,196,308 | 4/1980 | Siden | 174/84 C |
| 4,208,788 | 6/1980 | Siden | 29/862 |
| 4,209,219 | 6/1980 | Proriette | 339/99 R |
| 4,214,121 | 7/1980 | Charneski | 174/84 C |
| 4,231,986 | 11/1980 | Brauer et al. | 264/272 |
| 4,281,210 | 7/1981 | Brauer et al. | 174/23 C |
| 4,295,703 | 10/1981 | Osborne | 339/98 |
| 4,297,155 | 10/1981 | Jervis | 156/86 |
| 4,318,580 | 3/1982 | Fleisher | 339/98 |
| 4,326,767 | 4/1982 | Silbernagel et al. | 439/392 |
| 4,369,284 | 1/1983 | Chen | 524/476 |
| 4,371,757 | 2/1983 | Debortoli et al. | 179/98 |
| 4,375,521 | 3/1983 | Arnold | 523/173 |
| 4,406,510 | 9/1983 | Debortoli | 339/103 M |
| 4,423,918 | 1/1984 | Filreis et al. | 439/392 |
| 4,425,017 | 1/1984 | Chan | 339/96 |
| 4,449,777 | 5/1984 | Baribeau | 339/103 R |
| 4,466,843 | 8/1984 | Shimirak | 156/48 |
| 4,473,714 | 9/1984 | Broswell | 174/78 |
| 4,504,699 | 3/1985 | Dones et al. | 174/84 |
| 4,600,261 | 7/1986 | Debbaut | 174/76 X |
| 4,634,207 | 1/1987 | Debbaut | 174/76 X |
| 4,639,483 | 1/1987 | Billigmeier et al. | 524/296 |
| 4,647,717 | 3/1987 | Uken | 174/84 C |
| 4,721,832 | 1/1988 | Toy | 174/87 |
| 4,734,061 | 3/1988 | Randall et al. | 439/709 |
| 4,741,940 | 5/1988 | Reed | 174/76 |
| 4,751,350 | 6/1988 | Eaton | 174/87 |
| 4,756,851 | 7/1988 | Billigmeier et al. | 252/272 |
| 4,846,721 | 7/1989 | Debruycker et al. | 439/411 |
| 4,864,725 | 9/1989 | Debbaut | 174/93 X |
| 4,875,870 | 10/1989 | Hardy et al. | 174/76 |
| 4,883,431 | 11/1989 | Uken et al. | 439/521 |
| 4,888,070 | 12/1989 | Clark et al. | 174/76 |
| 4,909,756 | 3/1990 | Jervis | 174/76 |
| 4,963,698 | 10/1990 | Chang et al. | 174/77 R X |
| 4,993,966 | 2/1991 | Levy | 439/411 |
| 5,140,746 | 8/1992 | Debbaut | 174/76 X |
| 5,357,057 | 10/1994 | Debbaut | 174/84 R |

OTHER PUBLICATIONS

*Materials News* from Dow Corning Jul./Aug. 1977.

*Materials News* from Dow Corning Jul./Aug. 1974.

Dow Corning Silicone "Notes" (SYLGARD 51 Dielectric Gel) Feb. 1960.

Dow Corning's "Information about Electronic Materials" (SYLGARD 51 Dielectric Gel) Feb. 1965.

Dow Corning's "Information about Electrical/Electronic Materials" (SYLGARD 51 Dielectric Gel) Jan. 1969.

Dow Corning Corp's "Silicone Elastomers Application/ Product Selection Guide for the Electrical/Electronic Industry", 1980.

"An Environmentally Sealed Terminal Block With Rotary Connection", Intl. Wire & Cable Symposium Proceedings, 1989 pp. 513–516.

"GE Silicones Selector Guide".

Dow Corning, "Information about Silicone Compounds" Copyright 1979.

"Gels and Their Sealing Applications in the Outside Plant," K. Dawes, C. Debbaut, A.P.P. Sutherland (International Wire & Cable Symposium Proceedings 1988).

"BIX: A Cross–Connect System Optimized for the Outdoors", Debortoli, Meyerstein & Velsher (in Telesis magazine, Bell–Norther Research Ltd. publication, 1982 Issue Four.

"Environmental Protection Methods for the BIX Connector–Salt Fog Tests", W.P. Trumble (Bell–Northern Research) May 1979.

Bell–Northern Research Technical Report, "The Results of Reliability Testing of the BIX Outdoor Cross–Connect System", M.V. Meyerstein Jan. 1982.

Northern Telecom Sales Brochure, "BIX Stands Out on the Job, Not on Public Property; BIX Beats the Weather Machine" Jan. 1982.

Norther Telecom Document, "BIX Outdoor Cross–Connect System–Description)" Dec. 10, 1981.

Northern Telecom Document, "BIX Outdoor Cross–Connect System, Ordering Information:" Dec. 11, 1981.

Northern Telecom Document, "BIX Outdoor Cross–Connect System, Installation, Testing and Servicing", Dec. 10, 1981.

"RTV 6159, Versatiles Transparent Silicone Gel", (General Electric).

"GE Silicones, RTV 6156, RTV 6166, RTV 6186 and RTV 6196, Silicone Dielectric Gels" (General Electric) (D–577) Copyright 1989.

"RTV6157, Transparent Silicone Gel GE Silicone Product Data" (D–578) Copyright 1985.

ANSI/ASTM D 1403, Standard Test Method for Penetration of Lubricating Grease Using One–Quarter and One–Half Scale Cone Equipment Reapproved 1974.

ANSI/ASTM D217 1982 Standard Test Methods for Cone Penetration of Lubricating Grease.

"An Introduction to Vistanex®LM Low Molecular Weight Polyisobutylene" POLYMERS Exxon Chemical Co.(1990/1992).

ELECTRICAL CONNECTOR

This application is a continuation of Ser. No. 08/324,420 filed Oct. 18, 1994 which is a continuation of Ser. No. 07/933,285, filed Aug. 21, 1992, now U.S. Pat. No. 5,357,057, which is a continuation of Ser. No. 07/396,575 filed Aug. 21, 1989, now U.S. Pat. No. 5,140,746 which is a continuation of Ser. No. 07/183,546 filed Apr. 18, 1988, now U.S. Pat. No. 4,864,725, which is a continuation of Ser. No. 07/038,415 filed Apr. 9, 1987 now abandoned, which is a continuation of Ser. No. 06/756,559 filed Jul. 17, 1985, now abandoned, which is a continuation of Ser. No. 06/507,433 filed Jun. 23, 1983, now abandoned, which is a continuation-in-part of Ser. No. 06/504,000 filed Jun. 13, 1983, now U.S. Pat. No. 4,634,207 which is a continuation-in-part of Ser. No. 06/434,211 filed Oct. 12, 1982, now U.S. Pat. No. 4,600,261.

TECHNICAL FIELD

The present invention relates to electrical connectors in which connection between electrical wires is effected by mechanical deformation of the connector.

BACKGROUND ART

It is well known to splice (i.e. connect) electrical wires by placing them within a connector and then permanently deforming the connector by mechanical pressure—see for example U.S. Pat. No. 4,208,788 to Siden. If the electrical wires so spliced are to be used in a corrosive, moist or hazardous environment, it is desirable to provide an environmental seal in association with the pressure connector in order to maintain an acceptable electrical connection between the electrical wires.

Such environmental seals are known and include, for example, a special box which is designed to house the wire splice. In practice, however, the special box does not provide a hermetic seal; ultimately, moisture and/or other foreign substances may permeate the special box and induce corrosion within the wire splice.

Other known environmental seals include a method of covering the spliced wires with a silicone grease. The silicone grease, however, is unsatisfactory since it can coat apparatus that should remain clean, and is displaced by vibration.

Environmental seals further include a crimp splicer wherein there is an associated insulating heat shrinkable sleeve which is adapted to retain a crimp barrel therein. In practice, the heat shrinkable sleeve may be shrunk down around the barrel and electrical wires in order to protect the splice from the environment. In some cases, however, it is disadvantageous or even prohibited, to employ a heating unit to heatshrink the sleeve.

SUMMARY OF THE INVENTION

I have now discovered an improved electrical pressure connector, which protects the electrical wires from a corrosive, moist or hazardous environment. The apparatus of the present invention is easy and convenient to employ and dispenses with a need for grease or a heat unit.

In one aspect, the present invention provides a connector, an insulating sleeve adapted to retain the connector, and an encapsulant disposed within the insulating sleeve and/or the connector, the encapsulant having a cone penetration value of 150 to 350 ($10^{-1}$ mm) and an ultimate elongation of at least 200%.

In another aspect, the present invention provides a process for splicing electrical wires, comprising the steps of:

a) inserting end sections of at least two electrical wires into an apparatus that comprises:
   (i) an electrical connector;
   (ii) a deformable insulating sleeve that surrounds and retains said electrical connector; and
   (iii) an encapsulant disposed within said insulating sleeve, said encapsulant having a cone penetration value of 100 to 350 ($10^{-1}$ mm) and an ultimate elongation of at least 200%; and b) exerting pressure on said electrical connector through said insulating sleeve, thereby permanently deforming the connector to electrically connect said electrical wires and encapsulate the electrical connection within the encapsulant.

The end sections of the wires can be stripped of insulation before being inserted into the connector, which, when it is crimped, mechanically deforms the end sections so that they are in physical as well as electrical contact. Alternatively the insulation can be left on the wires, in which case the connector must comprise an insulation displacing member which, when the connector is crimped, displaces insulation on the end sections and effects electrical connection between the wires.

BRIEF DESCRIPTION OF THE DRAWING

The invention is illustrated in the accompanying drawing in which.

DETAILED DESCRIPTION OF THE INVENTION

Figure 1:
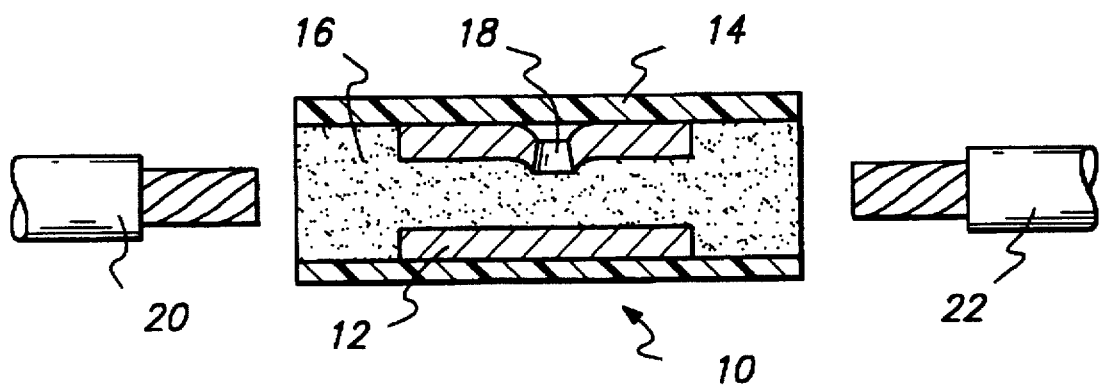
FIG. 1 is a cross-sectional view of a first embodiment of the present invention.

The invention is described herein mainly by reference to an in-line crimp splicer as shown in FIG. 1, but it is to be understood that the invention extends to electrical pressure connectors, generally, and therefore further encompasses e.g. pigtail connectors (or wires joints). It is also noted that the invention may be practiced when it is desired to connect two or more electrical wires.

Attention, accordingly, is directed to FIG. 1 which shows a cross-sectional view of a crimp splicer 10. The crimp splicer 10 includes three elements: a connector 12, an insulating sleeve 14 and an encapsulant 16. These elements are now discussed in detail, but it is to be understood that the various features disclosed with reference to FIG. 1 are also applicable, mutatis mutandis, to other pressure connectors of the invention.

The connector 12 is preferably cylindrical or barrel shaped and consists of a ductile metal which is a good conductor and is capable of being deformed with a crimping device (not shown). Suitable metals are copper, aluminum or brass. The connector 12 is also provided with a centrally located conductor stop 18 formed by perforating one side of the wall of the connector 12 and forcing a portion of the wall into the interior of the connector 12.

The insulating sleeve 14 is generally cylindrically-shaped and has a bore formed therein which runs the length of the sleeve. The sleeve 14 is shaped and sized to enable mechanical retention of the connector 12 disposed within the bore of the sleeve 14. Suitable materials for the sleeve 14 include nylon and polyvinylidene fluoride, since the necessary crimping force can be applied through these materials, in an appropriate manner well known in the art, without damage to the insulating sleeve or loss of retention of the connector 12.

The encapsulant 16 has a cone penetration value of 100 to 350 ($10^{-1}$ mm), preferably 100 to 250. (Note that the cone penetration value is determined in accordance with the American National Standard Designation ASTM D217-68 on an undisturbed sample at 70° F.±5° F. using a standard 1:1 scale cone (cone weight 102.5 g, shaft weight 47.5 g), the penetration being measured after 5 seconds). Further, the encapsulant 16 has an ultimate elongation of at least 200%, especially at least 500%: and generally has a maximum tensile strength of approximately 20 psi. (Note that these parameters are determined in accordance with the American National Standard Designation ASTM D638-80, at 70° F.±5° F., using a Type 4 die to cut the sample and at a speed of 50 cm/minute).

The encapsulant 16 may be prepared by gelling a liquid mixture comprising suitable gel precursor materials, eg. polyurethane or polysiloxane precursor materials, together with suitable reactive or non-reactive extenders. For example, suitable encapsulants can be made by gelling a mixture comprising conventional cutable polyurethane precursor materials in the presence of substantial quantities of a mineral or vegetable oil or a mixture thereof (eg. in amount 60 to 80%) or a suitable plasticizer, eg. a trimellitate such as n-octyl-n-decyl trimellitate (eg. in amount 30 to 70%). A suitable reactive extender for polyurethane precursors is a mixture of mineral and vegetable oils in which the ratio by weight of mineral oil to vegetable oil is 0.7 to 2.4, the mixture of oils being present in amount 80 to 60%, preferably 80 to 70%, by weight based on the total weight of the polyurethane precursor materials and the mixture of mineral and vegetable oils. The encapsulant 16 may contain known additives such as moisture scavengers (e.g. benzoyl chloride), antioxidants, fillers, pigments, and fungicides. Especially when the wires are crimped into direct physical contact, the encapsulant can contain abrasive fillers which will pierce through any oxide or other passivating layer on the conductors, particularly aluminum conductors, especially in medium and high voltage joints. Other specific compositions for encapsulant 16 are conceivable and may be employed within the scope of the present invention. For example, the composition may be prepared by curing reactive silicones dissolved in non-reactive extender silicones. The encapsulant 16 is electrically insulating and preferably has a volume resistivity of at least $10^9$ ohms centimeter. Additionally, the encapsulant 16 is hydrolytically stable, moisture insensitive, substantially inert towards the insulating sleeve 14 and tacky.

Note that it is advantageous to dispose the encapsulant 16 within the sleeve 14 so that it substantially fills up the bore which runs the length of the sleeve 14. In this manner, the electrical wires 20 and 22 penetrate the encapsulant 16, which then seals behind the inserted wires 20 and 22. Moreover, the encapsulant 16 is voided from the area of electrical contact by the mechanical pressure generated during the crimping step (d) above. In this way, consequently, the present invention provides an electrical splice: the encapsulant 16 ensures that the splice protects the electrical wires 20 and 22 from a corrosive, moist or hazardous environment. In an alternative embodiment of the present invention, not shown, the sleeve 14 is provided with flexible end-guards which shield and protect the encapsulant 16 from dust and incidental contact with solvents.

Figure 2:
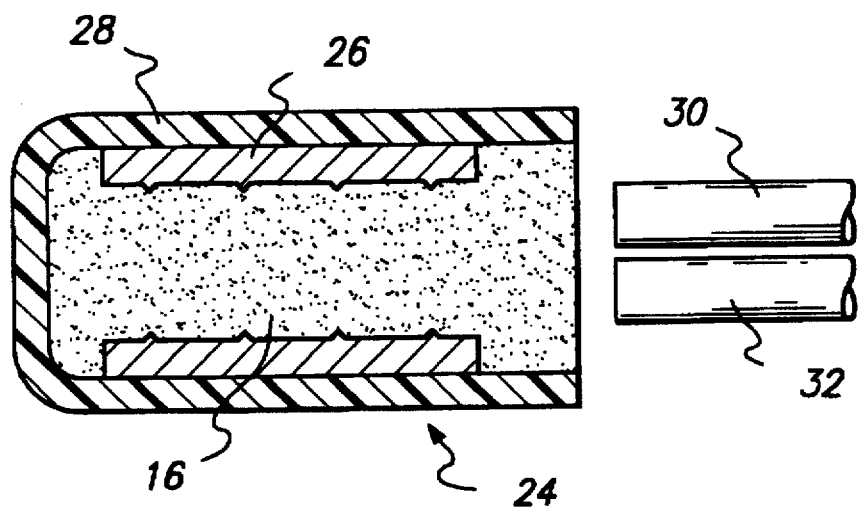
FIG. 2 is a cross-sectional view of a second embodiment of the present invention.

The apparatus of the present invention also extends to a "B-Wire" connector 24 of the type shown in FIG. 2. Here, a connector 26 which is covered with an insulated layer 28 is adapted to receive insulated electrical wires (numerals 30,32). The apparatus comprises an insulation-displacing member which, when the connector 24 is crimped around insulated electrical wires placed within the connector, displaces insulation on the electrical wires and effects electrical connection between the wires.

The present invention, in summary, may be employed to maintain an acceptable electrical connection between spliced wires by encapsulating and hence sealing the electrical connection from an adverse environment. Although specific embodiments of the present invention have been described herein, it will be obvious to those skilled in the art that various modifications may be made without departing from the spirit of the invention. With the foregoing in mind, it is understood that the invention be accorded the full scope of the appended claims.

I claim:

1. Apparatus for splicing electrical wires, comprising:
    a) an electrical connector which is adapted to receive electrical wires and to be mechanically deformed to electrically connect said electrical wires received therein;
    b) an insulating sleeve adapted to surround and retain said connector; and
    c) a polysiloxane based encapsulant disposed within at least one of said electrical connector and said insulating sleeve, said encapsulant having a cone penetration value of 100 to 350 ($10^{-1}$ mm) and an ultimate elongation of at least 200%.

2. An article as recited in claim 1 wherein the insulating sleeve is selected from the group consisting of a tubular member having opposing open ends with the electrical connector positioned therein, or an insulating sleeve having one closed end and an open end opposite thereto for receiving said electrical wires.

3. An article for splicing electrical wires comprising:
    (a) an electrical connector which is adapted to receive electrical wires and to be mechanically deformed to electrically connect said electrical wires received therein, said electrical wires selected from the group consisting of: electrical wires with insulation, electrical wires with the insulation removed, and combinations thereof;
    (b) an insulating sleeve adapted to surround and retain said electrical connector; and
    (c) an encapsulant disposed and positioned within said insulating sleeve and enveloping said electrical connector, so that said electrical wires received therein penetrate the encapsulant to be environmentally sealed, said encapsulant having been prepared by curing reactive silicones with non-reactive extender silicones to form a solid having a cone penetration value from 150 to 350 ($10^{-1}$ mm) and an ultimate elongation of at least 200%.

4. The article as recited in claim 2 wherein the encapsulant has an ultimate elongation of at least 500% and the material is a polysiloxane gel.

* * * * *